United States Patent
Choi et al.

(10) Patent No.: US 8,642,128 B2
(45) Date of Patent: Feb. 4, 2014

(54) ENHANCED SCAVENGING OF RESIDUAL FLUORINE RADICALS USING SILICON COATING ON PROCESS CHAMBER WALLS

(75) Inventors: Dongwon Choi, San Jose, CA (US); Dong Hyung Lee, Kyunggi (KR); Tze Poon, Sunnyvale, CA (US); Manoj Vellaikal, Sunnyvale, CA (US); Peter Porshnev, San Jose, CA (US); Majeed Foad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 631 days.

(21) Appl. No.: 12/758,167

(22) Filed: Apr. 12, 2010

(65) Prior Publication Data

US 2010/0267224 A1    Oct. 21, 2010

Related U.S. Application Data

(60) Provisional application No. 61/170,879, filed on Apr. 20, 2009.

(51) Int. Cl.
*C23C 16/00* (2006.01)

(52) U.S. Cl.
USPC ................... 427/255.395; 427/579

(58) Field of Classification Search
None
See application file for complete search history.

(56) References Cited

U.S. PATENT DOCUMENTS

| | | | | |
|---|---|---|---|---|
| 5,812,403 A | * | 9/1998 | Fong et al. ............. | 700/121 |
| 5,879,574 A | * | 3/1999 | Sivaramakrishnan et al. .. | 216/60 |
| 5,935,334 A | * | 8/1999 | Fong et al. ............ | 118/723 ME |
| 5,935,340 A | * | 8/1999 | Xia et al. .............. | 134/1.1 |
| 5,939,831 A | * | 8/1999 | Fong et al. ............ | 315/111.21 |
| 5,963,840 A | * | 10/1999 | Xia et al. .............. | 438/783 |
| 5,968,587 A | * | 10/1999 | Frankel ................ | 427/8 |
| 5,976,900 A | * | 11/1999 | Qiao et al. ............. | 438/14 |
| 5,994,209 A | * | 11/1999 | Yieh et al. ............. | 438/541 |
| 6,019,848 A | * | 2/2000 | Frankel et al. ......... | 118/715 |
| 6,099,647 A | * | 8/2000 | Yieh et al. ............. | 118/697 |
| 6,110,556 A | * | 8/2000 | Bang et al. ............ | 428/64.1 |
| 6,114,216 A | * | 9/2000 | Yieh et al. ............. | 438/424 |
| 6,121,161 A | * | 9/2000 | Rossman et al. ....... | 438/783 |

(Continued)

FOREIGN PATENT DOCUMENTS

EP    0 892 083 B1    3/2003

OTHER PUBLICATIONS

Search Report dated Jul. 2, 2013 from the State Intellectual Property Office of the People's Republic of China for Chinese Patent Application No. 201080017514.8.

(Continued)

*Primary Examiner* — David E Graybill
(74) *Attorney, Agent, or Firm* — Moser Taboada; Alan Taboada

(57) ABSTRACT

Methods and apparatus for processing a substrate are provided herein. In some embodiments, an apparatus for substrate processing includes a process chamber having a chamber body defining an inner volume; and a silicon containing coating disposed on an interior surface of the chamber body, wherein an outer surface of the silicon containing coating is at least 35 percent silicon (Si) by atom. In some embodiments, a method for forming a silicon containing coating in a process chamber includes providing a first process gas comprising a silicon containing gas to an inner volume of the process chamber; and forming a silicon containing coating on an interior surface of the process chamber, wherein an outer surface of the silicon containing coating is at least 35 percent silicon.

17 Claims, 2 Drawing Sheets

(56) References Cited

U.S. PATENT DOCUMENTS

| | | | |
|---|---|---|---|
| 6,347,636 B1* | 2/2002 | Xia et al. | 134/1.1 |
| 6,348,099 B1* | 2/2002 | Xia et al. | 118/697 |
| 6,352,591 B1* | 3/2002 | Yieh et al. | 118/697 |
| 6,444,037 B1* | 9/2002 | Frankel et al. | 118/715 |
| 6,559,052 B2* | 5/2003 | Li et al. | 438/680 |
| 6,589,868 B2* | 7/2003 | Rossman | 438/680 |
| 6,623,846 B2* | 9/2003 | Laird | 428/216 |
| 6,645,303 B2* | 11/2003 | Frankel et al. | 118/725 |
| 6,846,742 B2* | 1/2005 | Rossman | 438/680 |
| 6,853,043 B2* | 2/2005 | Yeh et al. | 257/437 |
| 7,109,114 B2* | 9/2006 | Chen et al. | 438/680 |
| 7,115,508 B2* | 10/2006 | Park et al. | 438/680 |
| 7,166,524 B2* | 1/2007 | Al-Bayati et al. | 438/530 |
| 7,204,913 B1 | 4/2007 | Singh et al. | |
| 7,659,184 B2* | 2/2010 | Vellaikal et al. | 438/480 |
| 7,691,755 B2* | 4/2010 | Li et al. | 438/778 |
| 7,700,486 B2* | 4/2010 | Park et al. | 438/680 |
| 7,968,439 B2* | 6/2011 | Li et al. | 438/514 |
| 8,337,960 B2* | 12/2012 | Shimazu et al. | 427/579 |
| 2001/0041252 A1* | 11/2001 | Laird | 428/216 |
| 2001/0054387 A1* | 12/2001 | Frankel et al. | 118/725 |
| 2002/0073922 A1* | 6/2002 | Frankel et al. | 118/715 |
| 2002/0146512 A1* | 10/2002 | Rossman | 427/255.28 |
| 2003/0143410 A1* | 7/2003 | Won et al. | 428/448 |
| 2003/0211735 A1* | 11/2003 | Rossman | 438/680 |
| 2004/0087139 A1* | 5/2004 | Yeh et al. | 438/636 |
| 2004/0252622 A1* | 12/2004 | Kariyada | 369/275.2 |
| 2005/0181617 A1 | 8/2005 | Bosch | |
| 2005/0221020 A1* | 10/2005 | Fukiage | 427/569 |
| 2005/0227499 A1* | 10/2005 | Park et al. | 438/778 |
| 2005/0250340 A1* | 11/2005 | Chen et al. | 438/758 |
| 2006/0081558 A1* | 4/2006 | Collins et al. | 216/67 |
| 2006/0093756 A1* | 5/2006 | Rajagopalan et al. | 427/569 |
| 2006/0189171 A1* | 8/2006 | Chua et al. | 438/800 |
| 2006/0219169 A1* | 10/2006 | Chen et al. | 118/715 |
| 2006/0219175 A1* | 10/2006 | Park et al. | 118/723 R |
| 2007/0201016 A1* | 8/2007 | Song et al. | 356/72 |
| 2007/0243693 A1* | 10/2007 | Nemani et al. | 438/424 |
| 2007/0264836 A1* | 11/2007 | Chen et al. | 438/736 |
| 2008/0118663 A1* | 5/2008 | Choi et al. | 427/579 |
| 2008/0286982 A1* | 11/2008 | Li et al. | 438/782 |
| 2009/0061092 A1 | 3/2009 | Kameshima et al. | |
| 2009/0120464 A1* | 5/2009 | Rasheed et al. | 134/21 |
| 2009/0197401 A1* | 8/2009 | Li et al. | 438/513 |
| 2009/0215251 A1* | 8/2009 | Vellaikal et al. | 438/513 |
| 2009/0229758 A1* | 9/2009 | Min et al. | 156/345.49 |
| 2010/0267224 A1* | 10/2010 | Choi et al. | 438/513 |

OTHER PUBLICATIONS

International Search and Written Opinion mailed Nov. 26, 2010 for PCT Application No. PCT/US2010/030700.

* cited by examiner

US 8,642,128 B2

ENHANCED SCAVENGING OF RESIDUAL FLUORINE RADICALS USING SILICON COATING ON PROCESS CHAMBER WALLS

CROSS-REFERENCE TO RELATED APPLICATIONS

This application claims benefit of U.S. provisional patent application Ser. No. 61/170,879, filed Apr. 20, 2009, which is herein incorporated by reference in its entirety.

FIELD

Embodiments of the present invention generally relate to semiconductor substrate processing.

BACKGROUND

Complementary metal oxide semiconductor (CMOS) technology is widely used in integrated circuits. A commonly used method of processing substrates during CMOS device fabrication involves the use of fluorine-based plasma precursors, for example, in a plasma doping process. However, excessive fluorine radicals dissociated during the plasma doping process aggressively erodes the underlying CMOS structures on the underlying substrate, resulting in significant process integration issues, device performance degradation, and the like.

Therefore, a need exists for improved methods and apparatus for reducing excessive fluorine radicals in fluorine-based plasma substrate processes.

SUMMARY

Methods and apparatus for processing a substrate are provided herein. In some embodiments, an apparatus for substrate processing includes a process chamber having a chamber body defining an inner volume; and a silicon containing coating disposed on an interior surface of the chamber body, wherein an outer surface of the silicon containing coating is at least 35 percent silicon (Si) by atom. The process chamber may be any suitable process chamber for substrate processing. This may include process chambers configured for forming a plasma. The plasma formed may be fluorine based.

In some embodiments, a method for forming a silicon containing coating in a process chamber includes providing a first process gas comprising a silicon containing gas to an inner volume of the process chamber; and forming a silicon containing coating on an interior surface of the process chamber, wherein an outer surface of the silicon containing coating is at least 35 percent silicon.

In some embodiments the silicon containing coating consists of, or consists essentially of silicon. In some embodiments the silicon containing coating may comprise of alternating layers of silicon and oxygen ($O_2$) and layers of silicon. In some embodiments, the coating may have a silicon and oxygen surface disposed on one surface wherein the oxygen concentration gradually decreases throughout the coating, resulting in an opposing surface of essentially silicon, or silicon rich.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of the invention and are therefore not to be considered limiting of its scope, for the invention may admit to other equally effective embodiments.

Figure 1:
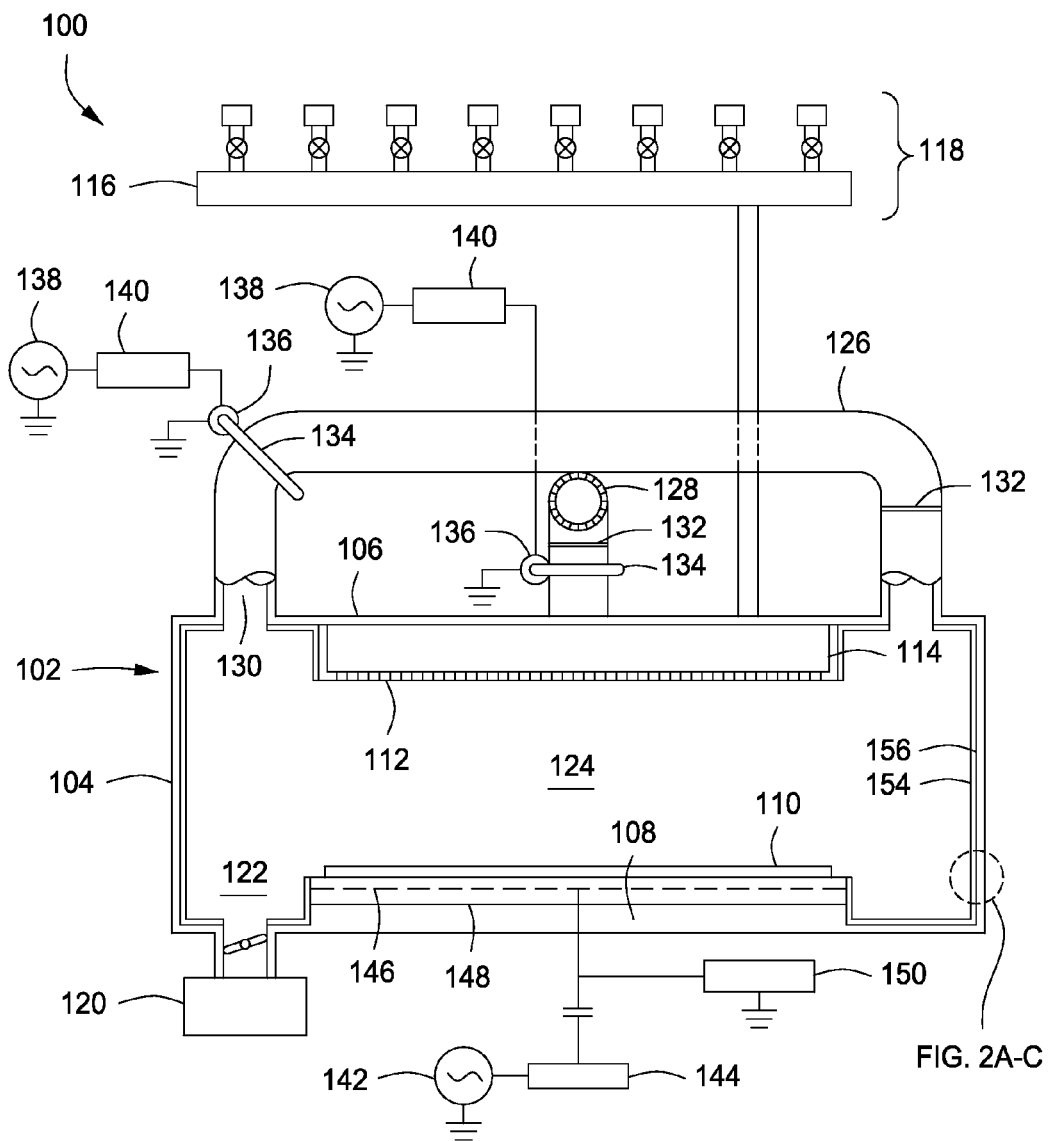
FIG. 1 depicts an apparatus suitable for processing semiconductor substrates in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention generally relate to apparatus and methods for fluorine-based plasma substrate processing. In some embodiments, a process chamber having a silicon or silicon-rich coating is provided to advantageously reduce residual fluorine radicals present in the chamber. In some embodiments, methods for forming the coating on the interior surfaces of the process chamber are provided. In some embodiments, methods for plasma doping are provided herein. The present invention may advantageously improve substrate processing by diminishing erosion of substrates by eliminating residual fluorine radicals in the process chamber.

Embodiments of the present invention may be incorporated in any suitable process chamber, such as process chambers configured for plasma doping processes or any other process that result in excess unwanted fluorine radicals in the process chamber. By way of a non-limiting example, one such suitable system is the P3i reactor available from Applied Materials, Inc., of Santa Clara, Calif. Such a suitable reactor and its method of operation are set forth in U.S. Pat. No. 7,166,524, assigned to the assignee of the invention, and which is incorporated herein by reference.

One example of a system suitable for modification and for processing substrates in accordance with some embodiments of the present invention is described below with respect to FIG. 1, which depicts a toroidal source plasma ion immersion implantation reactor 100. Referring to FIG. 1, the toroidal source plasma immersion ion implantation reactor 100 has a cylindrical process chamber 102 defined by a cylindrical side wall 104 and a disk-shaped ceiling 106. A substrate support 108 at the floor of the process chamber supports a substrate 110 to be processed. A gas distribution plate or showerhead 112 on the ceiling 106 receives process gas in its gas manifold 114 from a gas distribution panel 116 whose gas output can be any one of or mixtures of gases from one or more individual gas supplies 118. A vacuum pump 120 is coupled to a pumping annulus 122 defined between the substrate support 108 and the sidewall 104. A processing region 124 is defined between the substrate 110 and the gas distribution plate 112.

The interior surface 156 of the cylindrical side wall 104 may be coated with a silicon containing coating 154 in accordance with the present invention. In some embodiments, the silicon containing coating substantially covers the interior surface 156 of the chamber body (e.g., the surfaces of the chamber body that define the inner volume). In some embodiments, as described below, the silicon containing coating 154 may be deposited during a plasma doping process, or immediately preceding such a process. The silicon containing coating 154 may include one or more layers and has an outer surface, or portion, (e.g., facing and exposed to the interior of the process chamber) that is exclusively silicon, that consists essentially of silicon (e.g., about 95 percent or more of silicon), or that is silicon-rich (e.g., about 35 percent or more of silicon by atom). Providing a coating that is about 35 percent or more of silicon (as compared to conventional silicon oxide coatings) may facilitate enhanced fluorine scavenging, thereby reducing the erosion of underlying silicon device structures during processing.

Figure 2A:
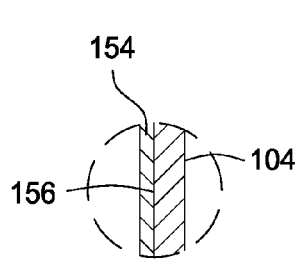
FIGS. 2A-C depict embodiments of a silicon containing coating disposed on an interior surface of a process chamber in accordance with some embodiments of the present invention.

In some embodiments, and as depicted in FIG. 2A, the silicon containing coating 154 may be a single layer consisting of silicon, consisting essentially of silicon, or having a silicon-rich composition. For example, the silicon containing coating 154 may have a silicon composition of about 35 percent or more.

Figure 2B:
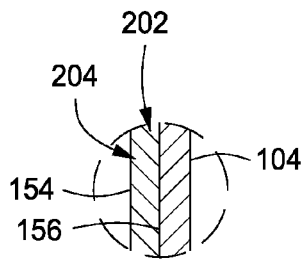

In some embodiments, as depicted in FIG. 2B, the silicon containing coating 154 may be a single layer having an outer surface 204 or portion that is silicon, essentially silicon, or silicon-rich, as discussed above (e.g., having a silicon composition of about 35 percent or more) and an inner surface 202 or portion comprising silicon and oxygen (e.g., $SiO_x$). The inner surface 202 is disposed adjacent to the interior surface 156 of the cylindrical side wall 104 (or to a layer formed on the interior surface 156 of the cylindrical side wall 104, for example as discussed below with respect to FIG. 2C). The oxygen concentration gradually decreases throughout the coating towards the outer surface 204, resulting in the opposing outer surface 204 having a silicon composition of about 35 percent or more. Providing an inner surface of the silicon containing coating 154 that is silicon oxide ($SiO_x$) may facilitate increased adhesion of the silicon containing coating 154 to the interior surface 156 of the cylindrical side wall 104, thereby providing reduced particle formation during processing. The rate of change of concentration of silicon in the silicon containing layer 154 may be linear, curved, continuous, discontinuous, or combinations thereof.

Figure 2C:
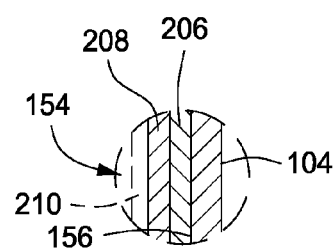

In some embodiments, and as depicted in FIG. 2C, the silicon containing coating 154 may be two or more layers, comprising a first layer 206 of silicon and oxygen disposed on the interior surface 156 of the cylindrical side wall 104 and a second layer 208 of silicon disposed atop the first layer. The second layer 208 of silicon may be any of the embodiments discussed above with respect to a single layer silicon containing coating 154 (e.g., a graded composition, a pure silicon composition, a silicon-rich composition, an essentially silicon composition, or in general a silicon composition of about 35 percent or more). In some embodiments, the silicon containing coating 154 may comprise more than two layers (as depicted in phantom by layer 210), wherein alternate layers include layers of silicon and oxygen and layers of silicon, and wherein at least the outermost layer (e.g., the layer exposed to the processing region 124) is any of the embodiments discussed above with respect to a single layer silicon containing coating 154.

In some embodiments, including any of the embodiments discussed above, at least the outermost silicon containing layer may contain at least one dopant. Such dopants may include boron (B), arsenic (As), phosphorous (P), germanium (Ge), carbon (C), nitrogen (N), or the like. The addition of a dopant to the outermost surface (or portion) of the silicon containing coating 154 may further facilitate the scavenging of fluorine during processing. In some embodiments, the dopant provided in the silicon containing coating 154 may be the same element utilized in a fluorine precursor gas during processing, as discussed in more detail below.

Returning to FIG. 1, a pair of external reentrant conduits 126, 128 establishes reentrant toroidal paths for plasma currents passing through the processing region 124, the toroidal paths intersecting in the processing region 124. Each of the conduits 126, 128 has a pair of ends 130 coupled to opposite sides of the process chamber. Each conduit 126, 128 is a hollow conductive tube. Each conduit 126, 128 has a D.C. insulation ring 132 preventing the formation of a closed loop conductive path between the two ends of the conduit.

An annular portion of each conduit 126, 128, is surrounded by an annular magnetic core 134. An excitation coil 136 surrounding the core 134 is coupled to an RF power source 138 through an impedance match device 140. The two RF power sources 138 coupled to respective ones of the annular magnetic cores 134 may be of two slightly different frequencies. The RF power coupled from the RF power sources 138 produces plasma ion currents in closed toroidal paths extending through the respective conduit 126, 128 and through the processing region 124. These ion currents oscillate at the frequency of the respective RF power source 138. Power is applied to the substrate support 108 by an RF bias power generator 142 through an impedance match circuit 144 or a DC power source 150.

Plasma formation and subsequent substrate processing is performed by introducing a process gas, or mixture of process gases into the process chamber 324 through the gas distribution plate 112 and applying sufficient source power from the generators 138 to the reentrant conduits 126, 128 to create toroidal plasma currents in the conduits and in the processing region 124. The plasma flux proximate the substrate surface is determined by the substrate bias voltage applied by the RF bias power generator 142. The plasma rate or flux (number of ions contacting the substrate surface per square cm per second) is determined by the plasma density, which is controlled by the level of RF power applied by the RF source power generators 138. The cumulative ion dose (ions/square cm) at the substrate 110 is determined by both the flux and the total time over which the flux is maintained.

If the substrate support 108 is an electrostatic chuck, then a buried electrode 146 is provided within an insulating plate 148 of the substrate support, and the buried electrode 146 is coupled to the RF bias power generator 142 through the impedance match circuit 144 or the DC power source 150.

In operation, a plasma may be generated from the process gases within the reactor 100 to process the substrate 110. The plasma is formed in the processing region 124 by applying sufficient source power from the generators 138 to the reentrant conduits 126, 128 to create plasma ion currents in the conduits 126, 128 and in the processing region 124 as described above. In some embodiments, the substrate bias voltage delivered by the RF bias power generator 142 can be adjusted to control the flux of ions to the substrate surface. In some embodiments, no bias power is applied.

Figure 3:
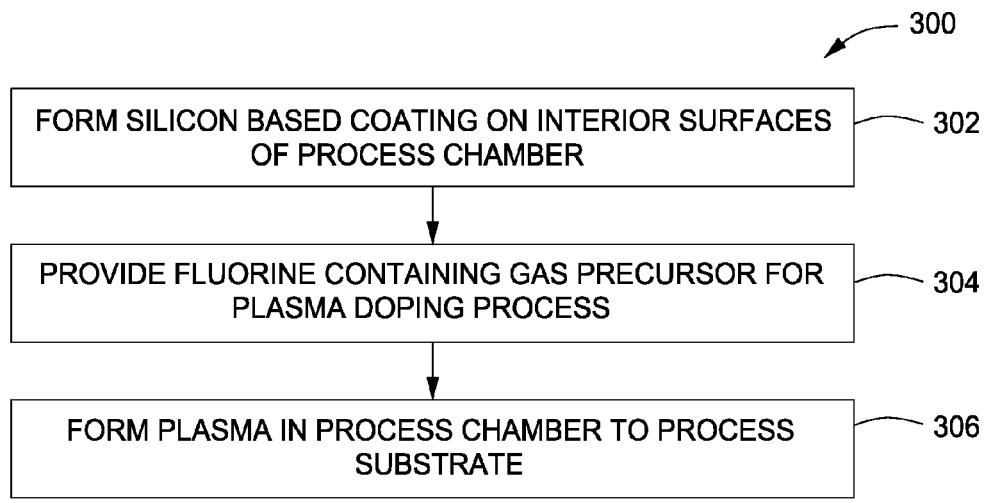
FIG. 3 depicts a method for processing substrates in accordance with some embodiments of the present invention.

FIG. 3 depicts a method for processing substrates in accordance with some embodiments of the present invention. The method of FIG. 3 can be understood with reference to the apparatus described in FIG. 1. The method 300 generally starts at 302 where a silicon based coating 154 may be formed on interior surfaces 156 of the process chamber. The silicon based coating 154 may be any of the embodiments described above and may be formed in a variety of ways.

Figure 4:
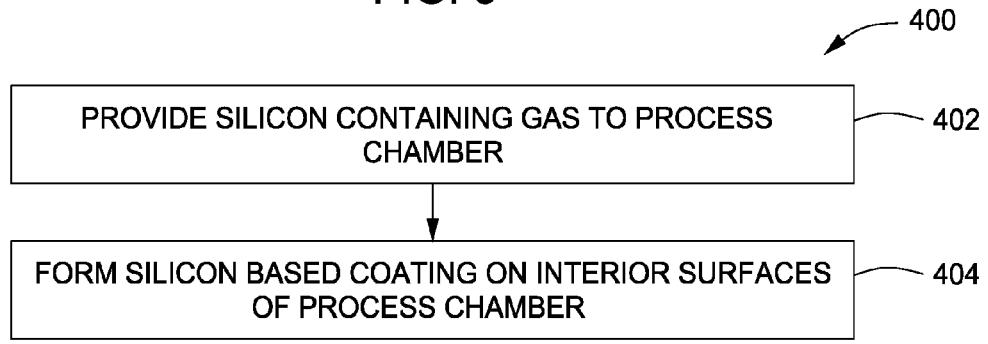
FIG. 4 depicts a method for forming a silicon containing coating on the interior surfaces of a process chamber in accordance with some embodiments of the present invention.

For example, as depicted in FIG. 4, a method 400 for forming a silicon based coating is provided and begins at 402 where a first process gas including a silicon containing gas is provided to the process chamber 102. In some embodiments, the silicon containing gas may comprise silane ($SiH_4$). In some embodiments, the first process gas may further comprise an inert gas, such as argon, helium, or the like, to enhance gas flow and facilitate plasma ignition. The first process gas may be provided to the chamber 102 at a flow rate of between about 10 to about 500 sccm.

At 404, the silicon containing coating 154 is then formed on the interior surfaces 156 of the process chamber 102. The silicon containing coating may be formed by chemical vapor deposition of the silicon containing gas provided at 402 upon the interior surfaces 156 of the process chamber 102. In some embodiments, for example, the process chamber 102 may be maintained at a pressure of between about 5 and about 300 mTorr and at a temperature of between about 0 and about 65 degrees Celsius while the silicon containing gas is provided. In some embodiments, RF power may be provided to facilitate igniting a plasma from the process gas and for coating densification. For example, RF source power of between about 200 to about 1000 W and, optionally, RF bias power of up to about 500 W may be provided. A silicon containing coating 154 formed by this process may have a composition of at least about 35 percent silicon. The first process gas may be provided and the deposition process may continue for a sufficient period of time to deposit a silicon containing coating 154 to a thickness of between about 500 Angstroms to about 10 µm.

Figure 5:
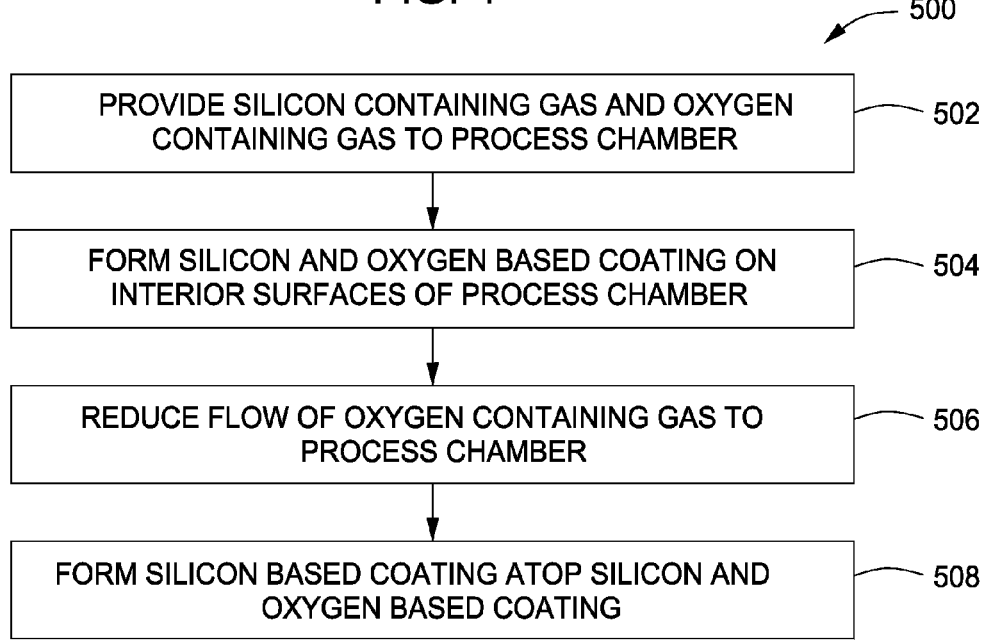
FIG. 5 depicts a method for forming a silicon containing coating on the interior surfaces of a process chamber in accordance with some embodiments of the present invention.

In some embodiments, as depicted in FIG. 5, a method 500 for forming a silicon based coating is provided where the silicon containing coating 154 comprises a first layer (or portion) comprising silicon and oxygen and a second layer (or portion) having a higher silicon composition than the first layer. The method 500 generally begins at 502 where a first process gas comprising a silicon containing gas and an oxygen containing gas are provided to the process chamber 102. The silicon containing gas may be any of the gases discussed above with respect to FIG. 4. For example, a suitable oxygen containing gas is oxygen ($O_2$). In some embodiments the silicon containing gas may comprise silane ($SiH_4$) and the oxygen containing gas may comprise oxygen ($O_2$). The first process gas may be provided to the chamber 102 at a total flow rate of between about 10 to about 500 sccm. In embodiments where the silicon containing gas is different from the oxygen containing gas, the silicon and oxygen containing gases may be provided at a flow rate ratio of silicon containing gas to oxygen containing gas of between about 10:1 to about 1:10. In some embodiments the flow rate of each of the silicon and oxygen containing gases may be between about 30 to about 300 sccm.

At 504, a first portion of the silicon containing coating 154 comprising silicon and oxygen is then formed on the interior surfaces 156 of the process chamber 102. The first portion may be formed by chemical vapor deposition of the silicon containing gas provided at 502 upon the interior surfaces 156 of the process chamber 102. In some embodiments, for example, the process chamber 102 may be maintained at a pressure of between about 5 and about 300 mTorr and at a temperature of between about 0 and about 65 degrees Celsius while the first process gas is provided. In some embodiments, RF power may be provided to facilitate igniting a plasma from the process gas and for densification of the Si coating. For example, an RF source power of between about 200 to about 1000 W and, optionally, an RF bias power of up to about 500 W may be provided. A first portion of the silicon containing coating 154 formed by this process may have a composition of silicon oxide ($SiO_x$). The first process gas may be provided and the deposition process may continue for a sufficient period of time to deposit a first portion or layer of the silicon containing coating 154 comprising silicon and oxygen to a thickness of between about 500 Angstroms to about 10 µm.

Next, at 506, the flow of the oxygen containing gas to the process chamber 102 may be reduced (including by terminating the flow of the oxygen containing gas). In some embodiments, the flow of the oxygen containing gas may be reduced while maintaining the flow of the silicon containing gas in the first process gas. In some embodiments, the flow of the first process gas may be stopped and a second process gas comprising a silicon containing gas (similar to those discussed above) may be provided to the process chamber 102. The silicon containing gas in the second process gas may be the same or different than the silicon containing gas in the first process gas. In some embodiments, the silicon containing gas in the second process gas is the same as the silicon containing gas in the first process gas.

The reduction in the flow of the oxygen containing gas may be gradual (such as at a desired rate of decline) or periodic, and may result in the complete termination of the flow of the oxygen containing gas. In some embodiments, the flow rate ratio of silicon containing gas to oxygen containing gas may be reduced from an initial flow rate ratio of between about 3:2 and about 6:1 to an ending flow rate ratio of between about 10:1 to about pure silicon containing gas. In some embodiments, the initial flow rate ratio (in actual sccm) for the silicon containing gas to the oxygen containing gas may be between about 300:200 and about 300:50 to an ending flow rate ratio of between about 300:30 to about 300:0.

Next, at 508, a silicon based coating (e.g., outer portion 204 or second layer 208) may be formed atop the silicon and oxygen based coating (e.g., inner portion 202 or first layer 206), for example by chemical vapor deposition at the same temperature and pressure conditions as discussed above. The reduction in the flow rate of the oxygen containing gas facilitates increasing the silicon content of the silicon containing coating 154 such that a second portion (or layer) of the silicon containing coating 154 may be deposited having a composition of at least about 35 percent silicon. The second process gas may be provided and the deposition process may continue for a sufficient period of time to deposit a second portion or layer of the silicon containing coating 154 comprising silicon to a thickness of between about 500 Angstroms to about 10 µm.

In some embodiments, the silicon and oxygen comprising first portion and the higher concentration silicon second portion together form the silicon containing coating 154 (see, for example, FIG. 2B). In some embodiments, the silicon and oxygen comprising first layer and the higher concentration silicon second layer together form the silicon containing coating 154 (see, for example, FIG. 2C). In some embodiments, the above process may be repeated as desired to form any desired amount of alternating layers to form the silicon containing coating 154. For example, the silicon containing coating 154 may include one or more intermediate layers (or portions) may be disposed between the first and second layers (or portions). In some embodiments, a third layer comprising silicon may be disposed atop the first layer comprising silicon and oxygen (e.g., between the first layer and the second layer)

and a fourth layer comprising silicon and oxygen may be disposed atop the third layer (e.g., between the third layer and the second layer). Such a silicon containing coating 154 would include a first layer comprising silicon and oxygen disposed on an interior surface of the process chamber, a third layer comprising silicon disposed atop the first layer, a fourth layer comprising silicon and oxygen disposed atop the third layer, and a second layer comprising at least 35 percent silicon disposed atop the fourth layer. The above layers (e.g., the first, second, third, and fourth layers) may be formed and may have any composition as similar layers discussed herein.

In some embodiments, such as any of the embodiments discussed above, the first or second process gas may also include a dopant containing gas for providing a dopant, such as boron (B), arsenic (As), phosphorous (P), germanium (Ge), carbon (C), nitrogen (N), or the like. The dopant containing gas may be the same or different than the silicon containing gas. Examples of suitable dopant containing gases include $BF_3$, $B_2H_6$, $AsH_3$, $PH_3$, $PF_3$, $GeH_4$, $CF_4$, or the like. In embodiments where the silicon containing gas is separate from the dopant containing gas, the silicon and dopant containing gases may be provided at a flow rate ratio of silicon containing gas to dopant containing gas of between about 10:1 to about 1:10, or in some embodiments, in sccm, from about 300:30 sccm to about 30:300 sccm. In some embodiments, the silicon containing coating 154 formed by this method (or at least an outer portion or second layer thereof) may have a composition of at least about 1 percent of one or more of the above dopants.

In some embodiments, such as any of the embodiments discussed above, the silicon containing coating 154 may be formed via a plasma-enhanced CVD process. In any of the above chemical vapor deposition processes, a plasma may be formed while maintaining a process chamber pressure of between about 10 mTorr to about 100 mTorr. In some embodiments, the plasma is formed providing between about 100 to about 1500 W of source RF power at a frequency of between about 11 to about 14 MHz.

In addition to the foregoing, additional process parameters may be regulated while depositing the silicon containing coating 154 to the desired thickness. For example, in some embodiments, the amount of time in which the chemical vapor deposition process is performed may be set at a predetermined processing period or after a desired thickness of the silicon containing coating 154 (or portion or layer thereof) is deposited.

Returning to FIG. 3, next, at 304, a fluorine containing gas is provided to the process chamber 102 as a plasma precursor for processing the substrate 110. In some embodiments, the fluorine containing gas may contain a dopant, such as boron, arsenic, phosphorous, germanium, carbon, nitrogen, or the like. For example, in some embodiments, the fluorine containing gas may comprise boron trifluoride ($BF_3$), phosphorus trifluoride ($PF_3$), phosphorus pentafluoride ($PF_5$), arsenic trifluoride ($AsF_3$), arsenic pentafluoride ($AsF_5$), or the like. The fluorine containing gas may be provided to the process chamber 102 at a flow rate of about 5 to about 350 sccm.

Next, at 306, a plasma is formed from the fluorine containing gas to facilitate processing the substrate 110. In some embodiments, the plasma is formed while maintaining the process chamber 102 at a pressure of between about 5 to about 100 mTorr. In some embodiments the plasma is formed providing about 100 to about 3000 W RF source power at a frequency of between about 40 kHz to about 14 MHz. Upon completion of plasma doping the substrate 110, the method 300 generally ends and the substrate 310 may be further processed as desired.

Thus, apparatus and methods for fluorine-based plasma substrate processing have been provided herein. In some embodiments, a process chamber having a silicon or silicon-rich coating is provided to advantageously reduce residual fluorine radicals present in the chamber. The present invention may advantageously improve substrate processing by diminishing erosion of substrates by eliminating residual fluorine radicals in the process chamber.

While the foregoing is directed to embodiments of the present invention, other and further embodiments of the invention may be devised without departing from the basic scope thereof.

The invention claimed is:

1. An apparatus for substrate processing, comprising:
   a process chamber having a chamber body defining an inner volume; and
   a single coating comprising silicon and oxygen disposed on an interior surface of the chamber body, wherein the coating has an inner surface proximate the interior surface and an outer surface that is at least 35 percent silicon (Si) by atom, and wherein the oxygen concentration decreases from the inner surface to the outer surface.

2. The apparatus of claim 1, wherein the apparatus is configured for processing with a plasma within the inner volume.

3. The apparatus of claim 2, wherein the plasma flows along a toroidal path, and wherein the inner volume forms a portion of the toroidal path.

4. The apparatus of claim 1, wherein the coating substantially covers surfaces of the chamber body that define the inner volume.

5. The apparatus of claim 1, wherein the outer surface of the coating is at least 95 percent silicon by atom.

6. The apparatus of claim 1, wherein the outer surface of the coating is substantially completely silicon by atom.

7. The apparatus of claim 1, wherein the concentration of oxygen proximate the outer surface is substantially zero.

8. The apparatus of claim 1, wherein the coating further comprises at least one of boron, arsenic, germanium, carbon, nitrogen, or phosphorous.

9. A method for forming a coating in a process chamber, comprising:
   providing a first process gas comprising a silicon containing gas and an oxygen containing gas to an inner volume of the process chamber; and
   forming a single coating comprising silicon and oxygen disposed on an interior surface of the process chamber at least partially from the first process gas, wherein the coating has an inner surface proximate the interior surface and an outer surface that is at least 35 percent silicon (Si) by atom, and wherein the oxygen concentration decreases from the inner surface to the outer surface.

10. The method of claim 9, wherein the first process gas comprises silane (SiH4).

11. The method of claim 9, wherein the first process gas further comprises at least one of boron, arsenic, germanium, carbon, nitrogen, or phosphorous.

12. The method of claim 9, wherein the outer surface of the coating is at least 95 percent silicon by atom.

13. The method of claim 9, wherein the oxygen containing gas is oxygen.

14. The method of claim 9, wherein the outer surface of the coating is substantially completely silicon by atom.

15. The method of claim 9, wherein the concentration of oxygen at the outer surface of the second layer is substantially zero.

16. The method of claim 9, further comprising:
   placing a substrate in the process chamber;

providing a fluorine containing gas plasma precursor to the process chamber;

forming a plasma in the process chamber from the fluorine containing gas; and processing the substrate with the plasma.

17. The method of claim 16, wherein the fluorine containing gas further comprises at least one of boron, arsenic, germanium, carbon, nitrogen, or phosphorous.

\* \* \* \* \*